United States Patent [19]

De Jong

[11] Patent Number: 5,680,407

[45] Date of Patent: Oct. 21, 1997

[54] DEVICE FOR TESTING MULTIPLE PULLING RESISTOR CONNECTIONS USING A SINGLE TEST POINT

[75] Inventor: Franciscus G.M. De Jong, Eindhoven, Netherlands

[73] Assignee: U.S. Philips Corporation, New York, N.Y.

[21] Appl. No.: 359,369

[22] Filed: Dec. 20, 1994

[30] Foreign Application Priority Data

Dec. 21, 1993 [EP] European Pat. Off. ............ 93203604

[51] Int. Cl.⁶ ...................................... G01R 31/00
[52] U.S. Cl. ............................................. 371/22.3
[58] Field of Search ........................ 371/22.3, 22.1, 371/27, 21.3; 324/73.1, 158.1, 765; 365/201, 189.07, 189.11; 395/183.19, 185.09

[56] References Cited

U.S. PATENT DOCUMENTS

| | | | |
|---|---|---|---|
| 4,651,084 | 3/1987 | Welsh et al. | 324/51 |
| 4,791,358 | 12/1988 | Sauerwald et al. | 324/73.1 |
| 4,879,717 | 11/1989 | Sauerwald et al. | 371/22.3 |
| 5,172,377 | 12/1992 | Robinson et al. | 371/22.3 |
| 5,285,119 | 2/1994 | Takahashi | 307/473 |
| 5,366,906 | 11/1994 | Wojnarowski | 437/8 |
| 5,379,302 | 1/1995 | Andrews | 371/22.3 |
| 5,450,415 | 9/1995 | Kamada | 371/22.3 |

OTHER PUBLICATIONS

IEEE Std. 1149.1–1990. "IEEE Standard Test Access Port and Boundary–Scan Architecture".

H. Bleeker et al., "Boundary–Scan Test, A Practical Approach", Kluwer Academic Publishers, Boston, US, 1993 ISBN 0–7923–9296, pp. 1–17.

*Primary Examiner*—Robert W. Beausoliel, Jr.
*Assistant Examiner*—Stephen C. Elmore
*Attorney, Agent, or Firm*—Anne E. Barschall

[57] ABSTRACT

A device which comprises an electronic circuit and at least two connections, each of which is connected to a separate output of the circuit and to a separate pulling resistor. The test resistor is connected between a fixed supply voltage and a test point with the pulling resistors connected to the test point and the electronic circuit arranged to test the connections by application of test data to the connections so that a given response is formed on the test point.

12 Claims, 3 Drawing Sheets

DEVICE FOR TESTING MULTIPLE PULLING RESISTOR CONNECTIONS USING A SINGLE TEST POINT

BACKGROUND OF THE INVENTION

This invention relates to a device which comprises an electronic circuit, a first connection with a first pulling resistor and a second connection with a second pulling resistor, a first output of the circuit being connected to the first connection and a second output of the circuit being connected to the second connection.

Logic circuits often utilize connections which are not actively used all of the time. An example of such a connection is a bus which transports the bits of one word from a transmitting IC to a receiving IC. There are often various transmitting ICs which exclusively utilize the bus for a given period of time. If the bus is not required by any transmitting IC at a given instant and during the switching-over from one transmitting IC to another transmitting IC, the bus temporarily does not receive signals. In order to prevent floating connections in such a case, causing a receiving IC connected to the bus to process non-defined values, each connection is provided with a pull-up resistor. This resistor is arranged between the connection and the supply voltage and pulls the connection to a fixed value at instants at which it is not driven by a transmitting IC.

After assembly of such a circuit, a test is performed so as to check whether all components have been correctly connected to the desired connections. In order to carry out such a test, each connection in a bus should thus far have its own test point for connection of a measuring instrument, for example, via a measuring pin. It is then tested whether the pull-up resistor is correctly connected to the test point and the supply voltage.

Logic circuits utilize ICs which are provided increasingly with Boundary Scan Test (BST) logic. These Its enable testing of the interconnection function of the circuit support in conformity with the BST method. In this respect see the pages 1 to 17 of the book "Boundary-Scan Test, A Practical Approach", Harry Bleeker, Peter van den Eijnden and Frans de Jong, Kluwer Academic Publishers, Boston, US, 1993, ISBN 0-7923-9296-5 for a description of testing according to the BST method.

For complete testing of a connection all connection points should be connected to its provided with BST logic or other logic capable of generating or analyzing test dam. This means that the connection comprising a pull-up resistor cannot be tested according to such a method because resistors do not comprise test logic.

It is, inter alia an object of the invention to test the connections comprising the pull-up resistors in buses in such a manner that a test point is not required for each pull-up resistor. Therefore, in accordance with one aspect of the invention there is provided a device which comprises an electronic circuit, a first connection with a first pulling resistor, and a second connection with a second pulling resistor, a first output of the circuit being connected to the first connection and a second output of the circuit being connected to the second connection, characterized in that a test resistor is connected between a supply terminal and a test point, the first pulling resistor being connected between the test point and the first connection, the second pulling resistor being connected between the test point and the second connection, the electronic circuit comprising a test attachment and being arranged to perform a test, under the control of predetermined signals on the test attachment, on the connections in a test procedure comprising: an initialization step and a number of follow-up steps, each of which includes the transfer of a unique combination of test data to the connections via the outputs in order to form a response on the test point. A further advantage of the invention resides in the fact that the testing of the connections with pull-up resistors is more compatible with the testing of the other connections.

A first version is characterized in that for the testing of the connections the circuit is arranged to execute a test according to the Boundary Scan Test method.

In another embodiment of the invention there is provided a device which comprises an electronic circuit, a first connection with a first pulling resistor, and a second connection with a second pulling resistor, a first input of the circuit being connected to the first connection and a second input of the circuit being connected to the second connection, characterized in that a test resistor is connected between a supply terminal and a test point, the first pulling resistor being connected between the test point and the first connection, the second pulling resistor being connected between the test point and the second connection, the electronic circuit comprising a test connection and being arranged to perform a test, under the control of predetermined signals on the test connection, on the connections in a test routine comprising:

(1) an initialization step, (2) application of test data to the connections by way of a voltage on the test point, (3) reception of result data from the connections, via the inputs, in the circuit and application of the result data to the test connection.

BRIEF DESCRIPTION OF THE DRAWING

A preferred embodiment of the invention will be described in detail hereinafter with reference to the accompanying drawings, in which.

DESCRIPTION OF THE PREFERRED EMBODIMENTS

Figure 1:
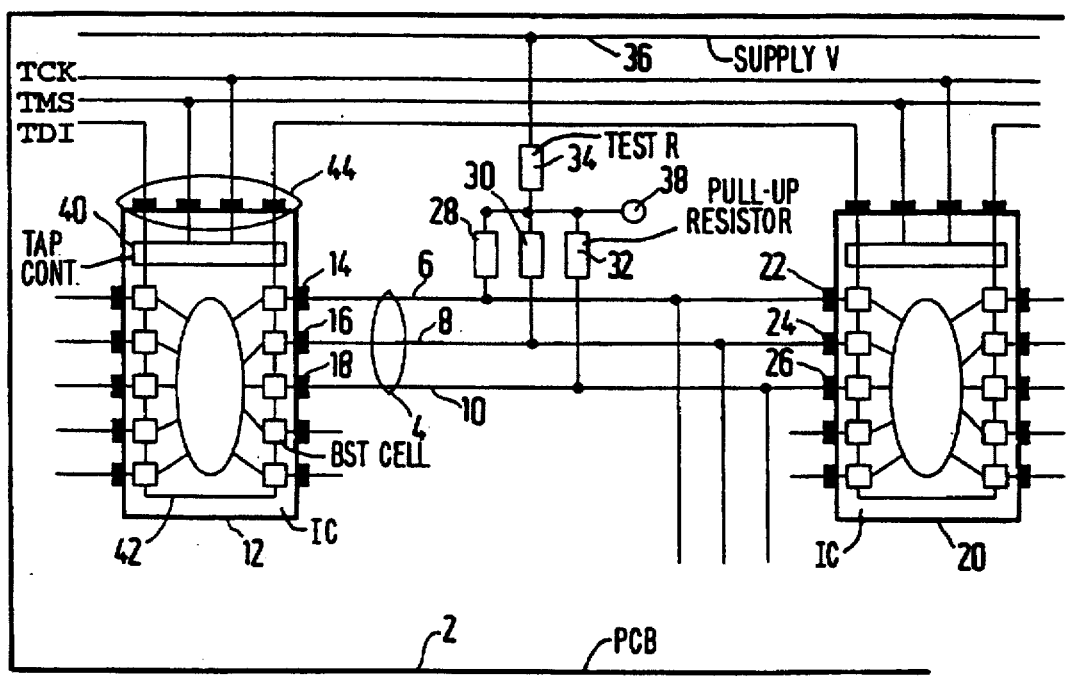
FIG. 1 shows a part of a support with a bus and two ICs connected to the bus.

Corresponding reference numerals in the Figures denote similar elements.

FIG. 1 shows a part of a support (2) with a bus (4) which in this case comprises three connections (6), (8) and (10). Connected to the bus are a number of ICs, two of which are shown: an IC (12) which applies data to the bus via outputs (14), (16) and (18), and an IC (20) which reads data from the bus via inputs (22), (24) and (26). The connections in the bus are connected to pull-up resistors (28), (30) and (32) which are connected, to the supply voltage (36), via a test resistor (34). The pull-up resistors are also connected to a test point (38) which is used during testing.

Both ICs of the embodiment shown in FIG. 1 are provided with test logic. This enables both types of test described hereinafter to be executed. The description of the types of test will state which IC must be provided with test logic. The ICs of the preferred embodiment are provided with Boundary Scan Test (BST) logic, but other forms of test logic are also feasible and will be described later. The ICs (12) and (20) are arranged to execute a test according to the BST method. To this end they comprise: a TAP controller and further means, symbolized by a block (40), for controlling the test and for applying test data to the correct locations via a concatenation (42) of BST cells containing a value for each pin, and a test attachment (44) for receiving test control data and test data and for passing on this data, if necessary. A detailed specification of the BST test logic is given in the BST standard (IEEE Std. 1149.1-1990).

The set-up shown in FIG. 1 is suitable for carrying out two types of test. According to the first type, the IC (12) applies test data to the bus via the BST cells, after which the voltage level produced on the test point (38) by the test data is measured. For this first type of test the IC (12) should be provided with test logic. According to the second type of test, a voltage is applied to the test point (38) and via the BST cells of the IC (20) the effects thereof on the connections are determined. For this second type of test the IC (20) should be provided with test logic.

Figure 2A:
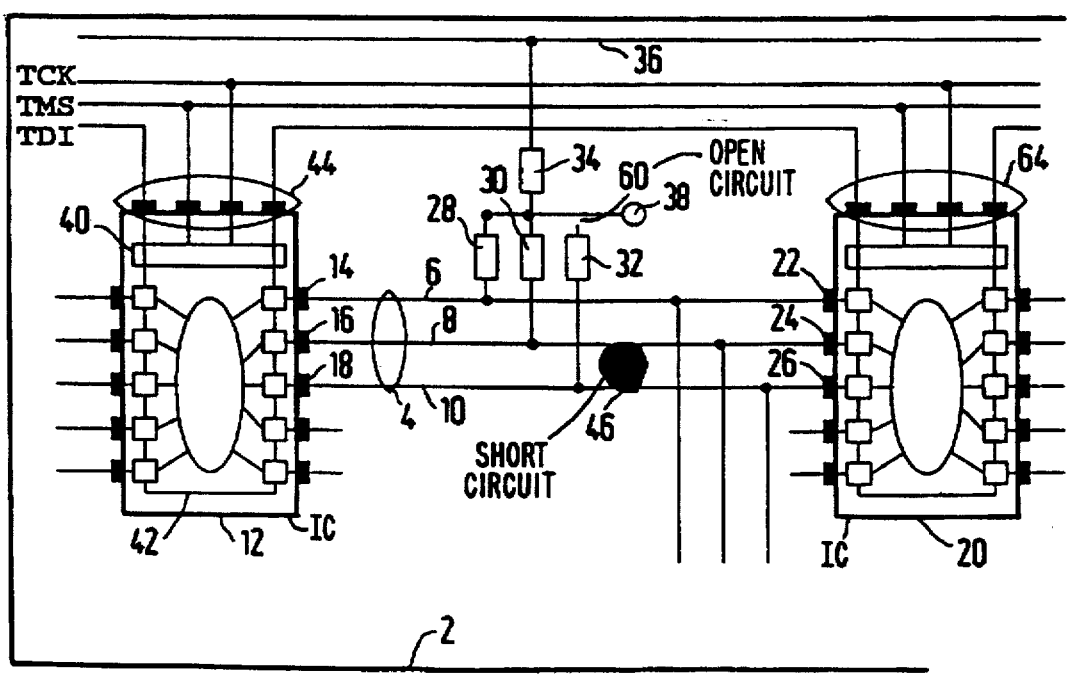
FIG. 2A shows a part of a support with a bus and two ICs connected to the bus in the presence of a short-circuit and a connection error.

FIG. 2A shows the same circuit as FIG. 1, but now with a short-circuit (46), for example, caused by a droplet of solder spilled during the assembly process, present between the connections (8) and (10). Also indicated is a connection error (60), involving incorrect connection of the pull-up resistor (32). A test concerning the situation involving exclusively the short-circuit (46) will now be described. The first step of the test consists in setting the IC (12) to the test mode by way of given control signals on the test attachment (44). Subsequently, a test pattern is applied to the bus a number of times by forming a given logic value on the outputs (14), (16) and (18) via the test attachment (44), followed by measurement of the voltage on the test point (38). The voltage on the test point (38) is the resultant of the supply voltage, via the test resistor (34), and the voltages on the connections (6), (8) and (10) via the pull-up resistors (28), (30) and (32). The application of test data to the IC (12) and the measurement of the voltage on the test point (38) will preferably be executed by one tester in a coordinated fashion.

Figure 2B:
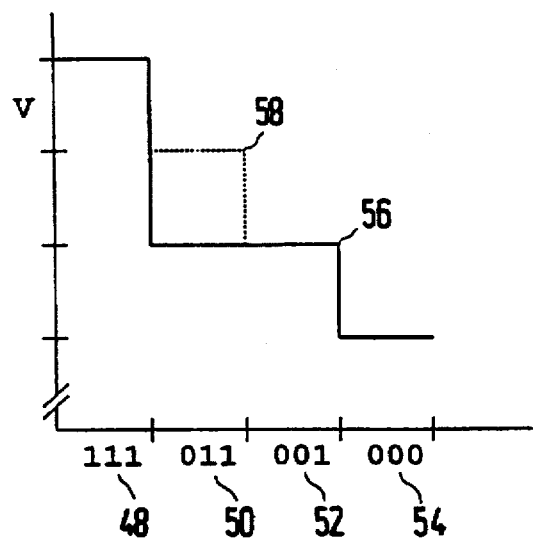
FIG. 2B shows the voltage level on the test point for different test patterns in the presence of the short-circuit.

For the circuit shown in FIG. 2A, FIG. 2B shows the voltage measured on the test point (38) for four patterns. The BST cells of the outputs (14), (16) and (18) successively have the values "111" (48), "011" (50), "001" (52) and "000" (54). The voltage measured on the test point is represented by a line (56). For the pattern (50) the measured voltage deviates from the anticipated voltage (58) due to the short-circuit (46) between the connections (8) and (10). Alternative patterns are feasible and the patterns may also be presented in a different sequence. In practice test patterns are determined on the basis of the relevant circuit and the test strategy to be followed.

Figure 2C:
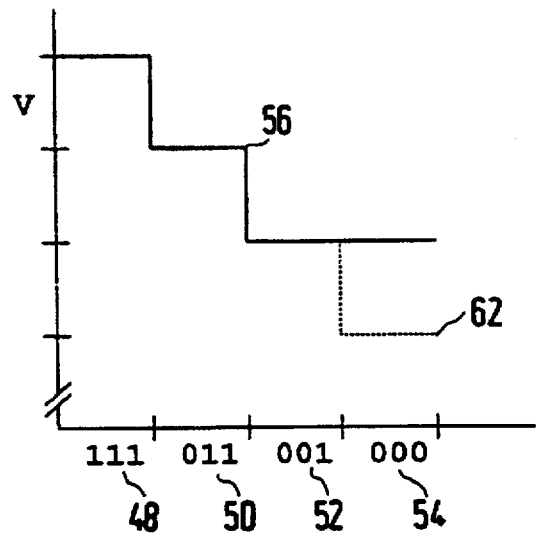
FIG. 2C shows the voltage level on the test point for various test patterns in the presence of the connection error.

Now the situation of FIG. 2A will be considered which involves only the connection error (60) and not the short-circuit. The test is the same as described above and the voltage measured on the test point is shown in FIG. 2C. In this case the voltage measured for the pattern (54) deviates from the anticipated value (62). This is due to the fact that the resistor (32) does not apply the logic "0" on the connection (10) to the test point (38). For this test it again holds that alternative patterns can be used and that the patterns can also be presented in a different sequence.

The connection error (60) in FIG. 2A can also be found by means of a second type of test. According to this test, the IC (20) is set to the test mode and test data is applied to the connections of the bus via a voltage on the test point (38). Subsequently, the signals on the bus are written into the BST cells of the inputs (22), (24) and (26) and applied to the test attachment (64) for observation. During a first read step, the test point (38) is not externally driven and the connections (6) and (8) will receive a logic "1" because of the pull-up resistors and the connection (10) will remain undefined. Assuming that in this implementation a floating connection becomes "1", the BST cells of the inputs (22), (24) and (26) will contain the pattern "111". During a second step the test point receives a low voltage, preferably via the tester. As a result, the connections (6) and (8) receive a logic "0", whereas the connection (10) is undefined again, because the low voltage is not passed on because of the error (60). The pattern "001" will then be read in the BST cells so that it can be concluded that the pull-up connection for the connection (10) is faulty.

In another embodiment of the invention the second type of test can be executed by the same IC as that executing the first type of test. This is the IC (12) in the FIGS. 1 and 2A. To this end, the outputs (14), (16) and (18) and their BST cells are then arranged to despatch test data as well as to write test data. The possibility of such a bidirectional BST cell is described in the BST standard and is used in practice in a number of types of IC.

For the determination of the value of the test resistor (34) two different conditions must be satisfied. The value should on the one hand be sufficiently small to keep mutual influencing of the signals on the connections whose pull-up resistors are connected to the same test resistor sufficiently small. Such influencing arises in that a variation of a signal on a connection causes a small voltage variation on the test point (38). This variation may not be so large that it changes the logic value of signals on the other connections. On the other hand, the value of the test resistor should be as large as possible so as to limit the current flowing through the test resistor at the instant at which the test point is pulled down. The current must be so small that the power dissipated in the test resistor remains limited, so that a regular low-power resistor can be used as the test resistor. The actual value of the test resistor should be determined for each circuit individually and is then also dependent on the technology which, inter alia, determines the voltage levels of the logic values and the number of connections via which voltage is applied to the test resistor.

A major advantage of the invention resides in the reduction of the number of test points. Each connection of each bus thus far requires its own test point, whereas according to the invention only one test point is required per bus. In a recent practical situation, in which two digital signal processors and their buses were mounted twice on a support in the form of a printed circuit board, a saving of 58 test points was achieved. This is particularly important because such a board already has a high density of components and connections.

The field of application of the invention is not restricted to a given type of logic or implementation thereof. Examples of applications are: bivalent logic, trivalent logic, TTL implementations and ECL implementations. The present embodiment concerns the situation in which the buses, when relevant, are supplied with a suitably defined value by way of pull-up resistors. Evidently, the invention can also be used when the buses are provided with pull-down resistors. This means a reversal of the test patterns for the tests.

Figure 3:
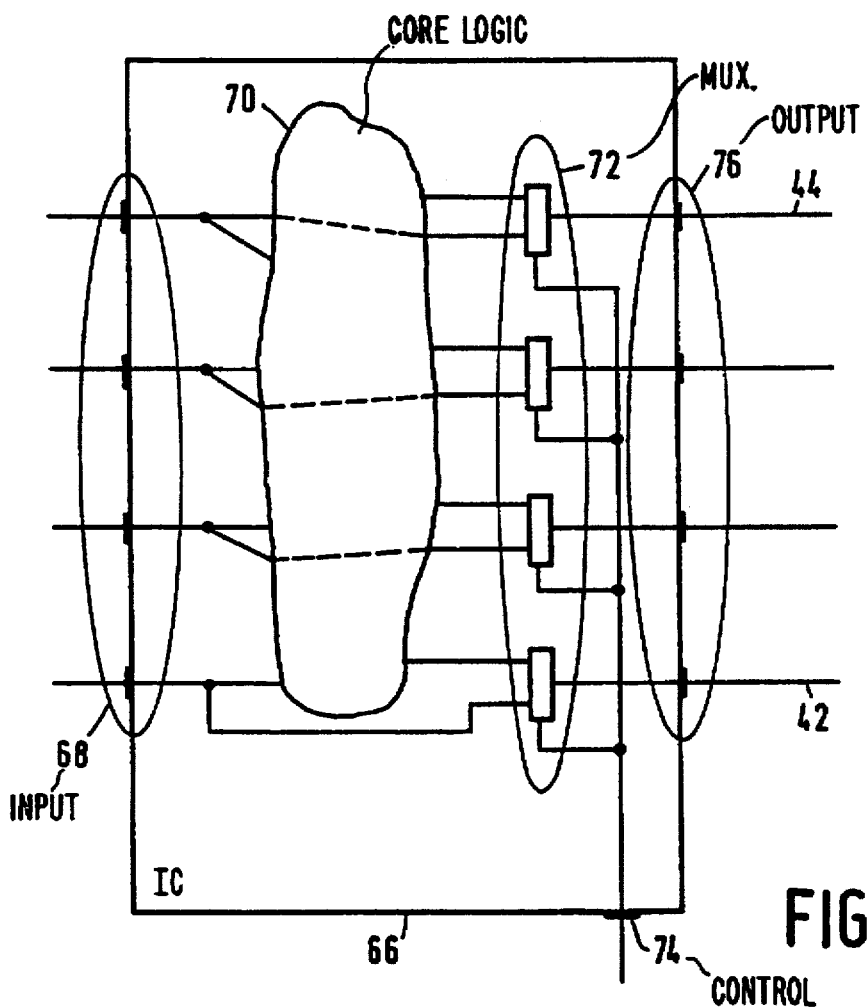
FIG. 3 shows an IC for providing test data on the outputs by way of multiplexers.

In order to carry out the invention, for the first type of test the IC (12) should be capable of transmitting test data via the connection and for the second type of test the IC (20) should be capable of receiving test data from the connection. In addition to the described BST method, various alternatives exist for the transmission and reception of test data. FIG. 3 shows an alternative for a transmitter and FIG. 5 shows an alternative for a receiver.

Figure 4:
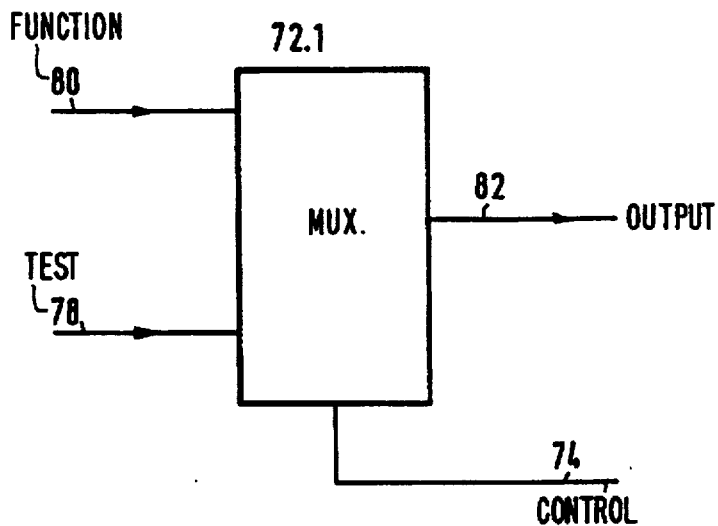
FIG. 4 is a detailed representation of a multiplexer of the IC.

FIG. 3 shows an IC (66) in which the input signals (68) are presented to the core logic (70) as well as to test inputs of the respective multiplexers (72). The control signal (74) determines whether the multiplexers apply the values on the test inputs or the values on the other, functional inputs to the outputs (76). FIG. 4 is a detailed representation of a multiplexer. The control signal (74) selectively determines that either the test signal (78) or the functional signal (80) appears as the output signal (82) of the multiplexer. Thus, via the control signal (74) data can be applied directly from inputs (68) to outputs (76). The test data is applied to the connections in this manner.

Figure 5:
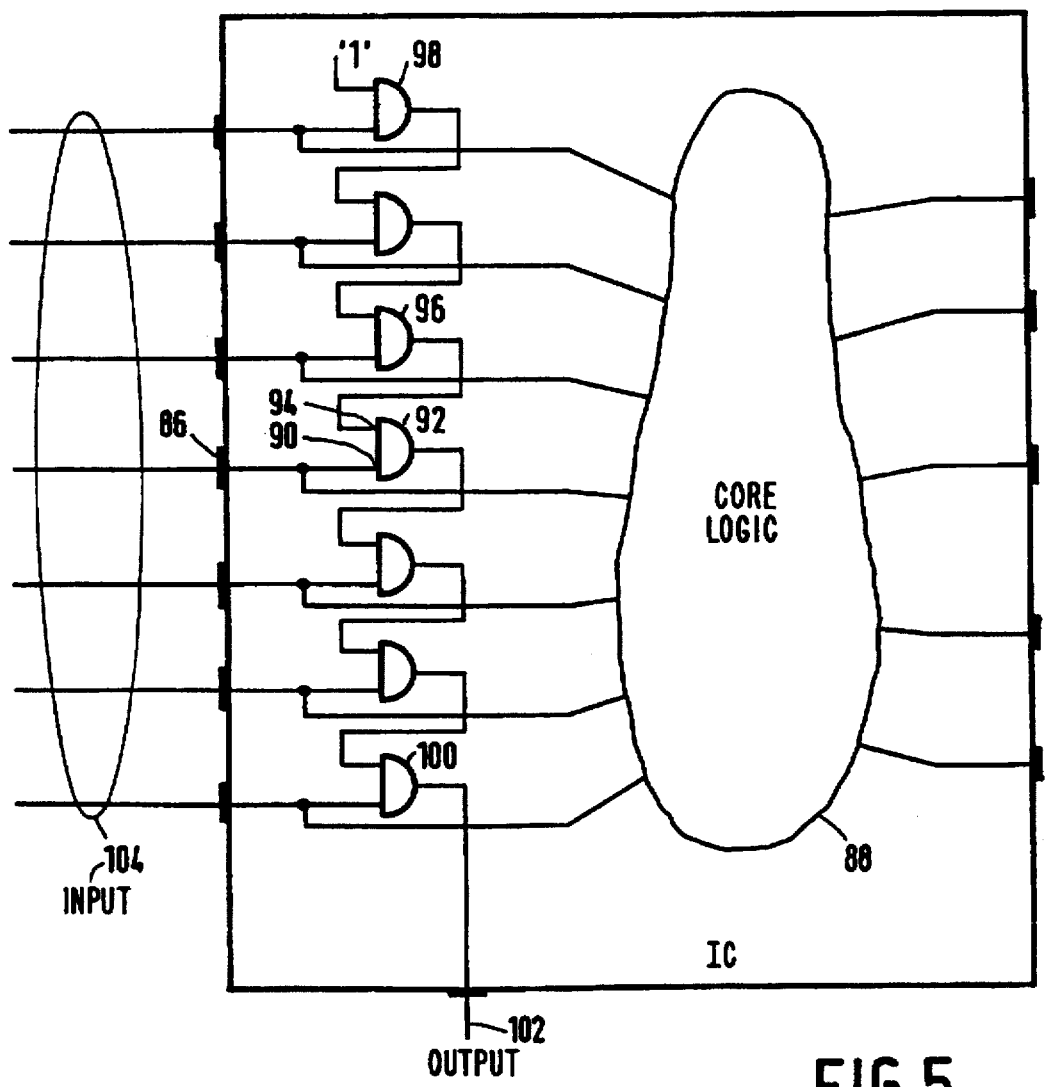
FIG. 5 shows an IC comprising logic AND-gates for the observation data on the inputs.

FIG. 5 shows an IC (84) which comprises connected to its inputs, a tree of logic AND-gates (AND-tree). An input, for example input (86), is connected to the core logic (88) as well as to an input (90) of an AND-gate (92). The other input (94) of the AND-gate is connected to the output of the preceding AND-gate (96) in the tree. One input of the first AND-gate (98) carries a logic "1". The output of the last AND-gate (100) carries the result of the preceding AND-operations on all connected inputs and this result is output via the connection (102). If all connected inputs receive a logic "1", a logic "1" will be present on the output (102). If at least one of the inputs receives a logic "0", a logic "0" will be present on the output. The state of the connections can be determined by application of test patterns to the connections (104) and by reading each time the output (102).

I claim:

1. A device which comprises: an electronic circuit, a first connection with a first pulling resistor, a second connection with a second pulling resistor, a first output of the electronic circuit being connected to the first connection and a second output of the electronic circuit being connected to the second connection, a test resistor connected between a supply terminal and a test point, the first pulling resistor being connected between the test point and the first connection, the second pulling resistor being connected between the test point and the second connection, the electronic circuit comprising a test attachment and being arranged to perform a test, under the control of predetermined signals on the test attachment, on the connections in a test routine comprising: an initialization step and a number of follow-up steps, each of which includes the transfer of a unique combination of test data to the connections, via the outputs of the electronic circuit, in order to form a response at the test point.

2. A device as claimed in claim 1, wherein for the testing of the connections the electronic circuit executes a test according to the Boundary Scan Test method.

3. A device as claimed in claim 1, wherein the resistance of the test resistor is small relative to the resistance of a parallel connection of the first and second pulling resistors.

4. A device which comprises: an electronic circuit, a first connection with a first pulling resistor, a second connection with a second pulling resistor, a first input of the electronic circuit being connected to the first connection and a second input of the electronic circuit being connected to the second connection, a test resistor connected between a supply terminal and a test point, the first pulling resistor being connected between the test point and the first connection, the second pulling resistor being connected between the test point and the second connection, the electronic circuit comprising a test attachment and being arranged to perform a test, under the control of predetermined signals on the test attachment, on the connections in a test routine comprising: (1) an initialization step, (2) application of test data to the connections by way of a voltage on the test point, (3) reception of result data from the connections, via the inputs in the electronic circuit, and application of the result data to the test attachment.

5. A device as claimed in claim 4, wherein the voltage on the test point in the step (2) is formed by a supply voltage present on said supply terminal.

6. A device as claimed in claim 4, wherein for the testing of the electronic connections the circuit executes a test according to the Boundary Scan Test method.

7. A device as claimed in claim 4, wherein the resistance of the test resistor is small relative to the resistance of a parallel connection of the first and second pulling resistors.

8. A device for testing multiple connections of a plurality of resistors connected to an electronic circuit, comprising:

an electronic circuit having at least first and second terminals, a supply terminal for connection to a source of supply voltage for the electronic circuit, at least first and second resistors connected to said first and second terminals of the electronic circuit, respectively, via first and second connections, respectively, a test resistor connected between the supply terminal and a test point, means connecting the first and second resistors in common to said test point, and means including the electronic circuit for applying a predetermined pattern of test data to said first and second connections thereby to test the reliability of the first and second connections.

9. The device as claimed in claim 8 wherein said electronic circuit comprises an integrated circuit mounted on a support and coupled via said first and second connections to a second integrated circuit also mounted on said support, said first and second connections being a part of a multi-connection bus coupling said first and second integrated circuits together via respective terminals thereof.

10. The device as claimed in claim 8 wherein said predetermined pattern of test data comprises binary digital data.

11. The device as claimed in claim 8 wherein the electronic circuit comprises test logic for applying said predetermined pattern of test data to said first and second connections and a voltage response at said test point provides a test indication of said first and second connections.

12. The device as claimed in claim 8 wherein a voltage is applied to the test point and the effects thereof on the first and second connections is determined by test logic in said electronic circuit.

* * * * *